US012593642B2

(12) United States Patent
Iga et al.

(10) Patent No.: US 12,593,642 B2
(45) Date of Patent: Mar. 31, 2026

(54) METHOD OF PROCESSING A WAFER

(71) Applicant: DISCO CORPORATION, Tokyo (JP)

(72) Inventors: Hayato Iga, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 182 days.

(21) Appl. No.: 18/475,509

(22) Filed: Sep. 27, 2023

(65) Prior Publication Data

US 2024/0120215 A1 Apr. 11, 2024

(30) Foreign Application Priority Data

Oct. 6, 2022 (JP) ................................. 2022-161592

(51) Int. Cl.
*H10P 72/00* (2026.01)
*B23K 26/53* (2014.01)
(Continued)

(52) U.S. Cl.
CPC .......... *H10P 72/0428* (2026.01); *B23K 26/53* (2015.10); *B24B 7/228* (2013.01); *B24B 9/065* (2013.01); *H10B 80/00* (2023.02); *H10P 10/12* (2026.01); *H10P 10/128* (2026.01); *H10P 34/42* (2026.01); *H10P 52/00* (2026.01); *H10P 54/00* (2026.01); *H10P 72/0452* (2026.01); *H10P 72/0604* (2026.01); *H10P 72/0616* (2026.01); *H10P 74/203* (2026.01); *H10P 74/23* (2026.01); *H10W 72/0198* (2026.01); *H10W 90/00* (2026.01); *H10W 72/073* (2026.01); *H10W 90/732* (2026.01)

(58) Field of Classification Search
CPC ...................... H01L 21/67092; B23K 26/0676
See application file for complete search history.

(56) References Cited

U.S. PATENT DOCUMENTS 6,420,245 B1 * 7/2002 Manor ................... B28D 5/022
438/460
7,682,225 B2 * 3/2010 Hongo ................... B24B 37/02
451/446

(Continued)

FOREIGN PATENT DOCUMENTS

CN 103862180 A * 6/2014 ............. H10F 39/12
DE 102020216544 A1 * 7/2021 ......... B23K 26/0626

(Continued)

*Primary Examiner* — Benjamin A Schiffman
(74) *Attorney, Agent, or Firm* — Greer Burns & Crain Ltd.

(57) ABSTRACT

A method of processing a wafer includes forming a bonded wafer assembly by bonding one of opposite surfaces of a first wafer to a second wafer, the first wafer having a device region and an outer circumferential excessive region, applying a laser beam to the first wafer while positioning a focused spot of the laser beam radially inwardly from the outer circumferential edge of the first wafer, on an inclined plane that is progressively closer to the one of the opposite surfaces of the first wafer toward the outer circumferential edge, thereby forming a separation layer shaped as a side surface of a truncated cone, grinding the first wafer from the other one of the opposite surfaces thereof to thin down the first wafer to a predetermined thickness, and detecting whether or not the outer circumferential excessive region has been removed from the first wafer.

3 Claims, 9 Drawing Sheets

(51) Int. Cl.

| | | |
|---|---|---|
| *B24B 7/22* | (2006.01) |
| *B24B 9/06* | (2006.01) |
| *H10B 80/00* | (2023.01) |
| *H10P 10/00* | (2026.01) |
| *H10P 34/42* | (2026.01) |
| *H10P 52/00* | (2026.01) |
| *H10P 54/00* | (2026.01) |
| *H10P 74/00* | (2026.01) |
| *H10P 74/20* | (2026.01) |
| *H10W 72/00* | (2026.01) |
| *H10W 90/00* | (2026.01) |

(56) References Cited

U.S. PATENT DOCUMENTS

| | | | | |
|---|---|---|---|---|
| 8,125,654 | B2 * | 2/2012 | Benvegnu | H01L 22/12 |
| | | | | 356/630 |
| 8,821,644 | B2 * | 9/2014 | Sakuragi | H01L 21/02087 |
| | | | | 134/6 |
| 9,138,913 | B2 * | 9/2015 | Arai | B41M 5/26 |
| 9,255,894 | B2 * | 2/2016 | VanHoomissen | |
| | | | | G01N 21/9505 |
| 9,815,138 | B2 * | 11/2017 | Hirata | B23K 26/0604 |
| 9,929,018 | B2 * | 3/2018 | Bieck | H01L 21/6704 |
| 10,249,518 | B2 * | 4/2019 | Adachi | B24B 49/003 |
| 10,576,585 | B1 * | 3/2020 | Donofrio | B23K 26/0006 |
| 10,870,176 | B2 * | 12/2020 | Hirata | B23K 26/0823 |
| 11,222,822 | B2 * | 1/2022 | Yamamoto | H01L 21/78 |
| 11,819,950 | B2 * | 11/2023 | Komatsu | B23K 26/0823 |
| 11,881,407 | B2 * | 1/2024 | Nagaya | H01L 21/2683 |
| 11,958,132 | B2 * | 4/2024 | Hirata | B28D 5/0011 |
| 12,011,781 | B2 * | 6/2024 | Ungaro | B23K 26/53 |
| 12,151,401 | B2 * | 11/2024 | Komatsu | B28D 5/0064 |
| 2004/0065647 | A1 * | 4/2004 | Kubo | H01L 21/67092 |
| | | | | 257/E23.179 |

| | | | | |
|---|---|---|---|---|
| 2004/0169869 | A1 * | 9/2004 | Shin | G01N 21/9501 |
| | | | | 356/635 |
| 2005/0199592 | A1 * | 9/2005 | Iri | B23K 26/40 |
| | | | | 219/121.6 |
| 2008/0128396 | A1 * | 6/2008 | Shigematsu | B23K 26/702 |
| | | | | 219/121.67 |
| 2008/0200100 | A1 * | 8/2008 | Takahashi | H01L 21/67219 |
| | | | | 438/692 |
| 2021/0197319 | A1 * | 7/2021 | Hirata | B23K 26/0006 |
| 2023/0036386 | A1 * | 2/2023 | Taylor | B23K 26/0652 |
| 2023/0048318 | A1 * | 2/2023 | Hirata | B23K 26/38 |
| 2023/0050807 | A1 * | 2/2023 | Iga | H01L 21/268 |
| 2023/0054570 | A1 * | 2/2023 | Sakamoto | B23K 26/53 |
| 2023/0066601 | A1 * | 3/2023 | Iga | B23K 26/53 |
| 2024/0087901 | A1 * | 3/2024 | Sekiya | B23K 26/0853 |
| 2024/0112902 | A1 * | 4/2024 | Iga | H01L 21/78 |
| 2024/0128087 | A1 * | 4/2024 | Iga | H01L 21/6835 |
| 2024/0145248 | A1 * | 5/2024 | Iga | H01L 22/12 |
| 2024/0153776 | A1 * | 5/2024 | Iga | H01L 21/02021 |
| 2024/0194501 | A1 * | 6/2024 | Iizuka | H01L 21/68728 |
| 2024/0297052 | A1 * | 9/2024 | Tanaka | H01L 21/78 |
| 2024/0304448 | A1 * | 9/2024 | Tanaka | H01L 21/304 |
| 2024/0304457 | A1 * | 9/2024 | Tanaka | H01L 21/304 |
| 2024/0339326 | A1 * | 10/2024 | Chen | H01L 21/67051 |
| 2024/0399494 | A1 * | 12/2024 | Hirata | B23K 26/38 |

FOREIGN PATENT DOCUMENTS

| | | | | | |
|---|---|---|---|---|---|
| JP | 2005032804 | A | * | 2/2005 | |
| JP | 2008500907 | A | * | 1/2008 | H01L 21/67023 |
| JP | 2008298696 | A | * | 12/2008 | G01N 21/8806 |
| JP | 2013237115 | A | * | 11/2013 | |
| JP | 2020057709 | A | | 4/2020 | |
| JP | 2020136662 | A | * | 8/2020 | H01L 21/67242 |
| JP | 2022043891 | A | * | 3/2022 | |
| JP | 2024011097 | A | * | 1/2024 | |

* cited by examiner

METHOD OF PROCESSING A WAFER

BACKGROUND OF THE INVENTION

Field of the Invention

The present invention relates to a method of processing a wafer and a wafer processing apparatus.

Description of the Related Art

The development of three-dimensionally laminated semiconductor wafers is in progress in view of efforts in recent years to make device chips lower in profile and higher in integration. For example, through-silicon-via (TSV) wafers make it possible to interconnect electrodes on two device chips with through-electrodes by bonding the device chips to each other.

Such a wafer is ground to thin itself down while being bonded to a support wafer as a base that is made of silicon, glass, ceramic, or the like. Usually, wafers have outer circumferential edges beveled. Therefore, when the wafers are ground to an ultrathin configuration, their beveled outer circumferential edges are turned into what is called knife edges, which tend to chip during the grinding step. Chips developed in the outer circumferential edges of wafers may possibly reach devices on the wafers, possibly breaking the devices.

To deal with knife edges, there has been devised an edge trimming method (see JP 2020-057709A). According to the edge trimming method, after a wafer has been bonded to a base, a laser beam is applied to the wafer along its outer circumferential edge around a device region of the wafer to form an annular modified layer in the wafer along the outer circumferential edge. When the wafer is thereafter ground, the annular modified layer prevents chips developed in the outer circumferential edge of the wafer from reaching devices on the wafer.

SUMMARY OF THE INVENTION

However, the edge trimming method disclosed in JP 2020-057709A is disadvantageous in that an end part of an outer circumferential excessive region of the wafer that is to be removed in the grinding step may possibly not be peeled off but remain unremoved, that regions disposed radially outwardly and inwardly of the annular modified layer may possibly collide with each other and be broken, and that a polishing pad used on the wafer in a subsequent polishing step may possibly be damaged.

It is therefore an object of the present invention to provide a method of processing a wafer bonded to a base and a wafer processing apparatus that are capable of removing an outer circumferential excessive region of the wafer while restraining devices on the wafer from being broken at the time when the wafer is being ground.

In accordance with an aspect of the present invention, there is provided a method of processing a wafer, including a bonded wafer assembly forming step of forming a bonded wafer assembly by bonding one of opposite surfaces of a first wafer to one of opposite surfaces of a second wafer, the first wafer having a device region where a plurality of devices are formed in the one of the opposite surfaces, an outer circumferential excessive region surrounding the device region, and a beveled outer circumferential edge, a separation layer forming step of applying a laser beam to the outer circumferential excessive region of the first wafer while positioning a focused spot of the laser beam in a region spaced a predetermined distance radially inwardly from the outer circumferential edge, on an inclined plane that is progressively closer to the one of the opposite surfaces of the first wafer toward the outer circumferential edge, thereby forming a separation layer shaped as a side surface of a truncated cone that is inclined from the one of the opposite surfaces of the first wafer to the other one of the opposite surfaces of the first wafer, a grinding step of, after the separation layer forming step has been carried out, grinding the first wafer of the bonded wafer assembly from the other one of the opposite surfaces of the first wafer to thin down the first wafer to a predetermined thickness, and a detecting step of, while the grinding step is being carried out or after the grinding step has been carried out, detecting whether or not the outer circumferential excessive region that extends from the separation layer to the outer circumferential edge has been removed from the first wafer.

Preferably, the detecting step includes applying measurement light to the outer circumferential excessive region that extends from the separation layer to the outer circumferential edge, and determining whether or not the outer circumferential excessive region has been removed from the first wafer, by detecting at least either light reflected by the outer circumferential excessive region or light reflected by the separation layer.

Preferably, the method of processing a wafer further includes an external force applying step of applying an external force to the outer circumferential excessive region to remove the outer circumferential excessive region from the first wafer, in a case where it is determined in the detecting step that the outer circumferential excessive region has not been removed from the first wafer.

In accordance with another aspect of the present invention, there is provided a wafer processing apparatus including a holding table for holding thereon a wafer that has a device region where a plurality of devices are formed in one of opposite surfaces of the wafer, an outer circumferential excessive region surrounding the device region, and a beveled outer circumferential edge, the wafer including a separation layer shaped as a side surface of a truncated cone that is inclined from the one of the opposite surfaces of the wafer to the other one of the opposite surfaces of the wafer so as to be progressively closer to the one of the opposite surfaces of the wafer toward the outer circumferential edge, in a region spaced a predetermined distance radially inwardly from the outer circumferential edge, such that the other one of the opposite surfaces of the wafer is exposed, a light source for applying measurement light to the outer circumferential excessive region of the wafer held on the holding table, a light detecting unit for detecting at least either light reflected by the outer circumferential excessive region or light reflected by the separation layer from the measurement light applied by the light source, and a determination section for determining whether or not the outer circumferential excessive region has been removed from the wafer along the separation layer functioning as a separation initiating point, on the basis of the light detected by the light detecting unit.

Preferably, the wafer processing apparatus further includes a grinding unit for grinding the other one of the opposite surfaces of the wafer held on the holding table, to thin down the wafer to a predetermined thickness.

According to the present invention, in the grinding step of grinding the first wafer of the bonded wafer assembly, the outer circumferential excessive region can be ground while the devices in the device region are prevented from being damaged.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
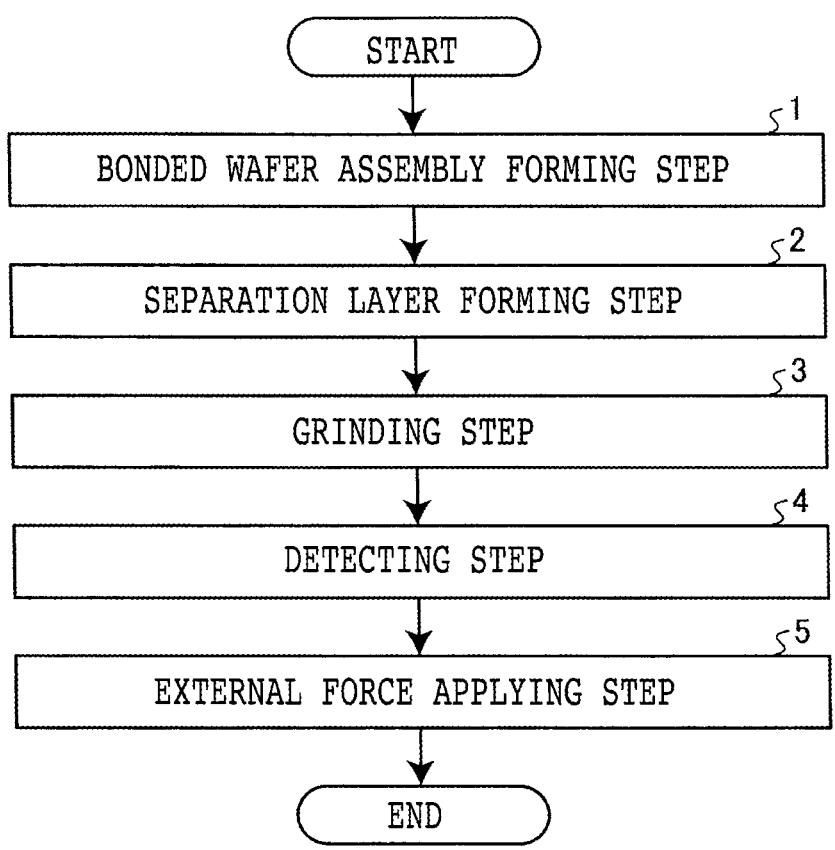
FIG. 1 is a flowchart of the sequence of a method of processing a wafer according to an embodiment of the present invention.

A preferred embodiment of the present invention will be described hereinbelow with reference to the accompanying drawings. The present invention is not limited to the details of the embodiment described below. The components described below cover those which could easily be anticipated by those skilled in the art and those which are essentially identical to those described below. Further, the arrangements described below can be combined in appropriate manners. Various omissions, replacements, or changes of the arrangements may be made without departing from the scope of the present invention. In the description below, those components that are identical to each other are denoted by identical reference characters.

A method of processing a wafer 10 (see FIG. 2) and a wafer processing apparatus 30 according to the present embodiment will be described below with reference to the drawings. The method of processing the wafer 10 according to the present embodiment represents a method of bonding a pair of wafers 10 to each other and thinning down one of the wafers 10, i.e., a first wafer 10-1, to a predetermined thickness.

In the description that follows, wherever the wafers 10 are to be distinguished from each other, one of them will be referred to as a "first wafer 10-1," and the other will be referred to as a "second wafer 10-2." Wherever the wafers 10 do not need to be distinguished from each other, they are simply referred to as "wafers 10." According to the present embodiment, the second wafer 10-2 that is not thinned down will be described as a TSV wafer as is the case with the first wafer 10-1. According to the present invention, however, the second wafer 10-2 may be a plain substrate wafer with no patterns thereon.

FIG. 1 is a flowchart of the sequence of the method of processing the wafer 10 according to the present embodiment. As illustrated in FIG. 1, the method of processing the wafer 10 according to the present embodiment includes a bonded wafer assembly forming step 1, a separation layer forming step 2, a grinding step 3, a detecting step 4, and an external force applying step 5.

Bonded Wafer Assembly Forming Step 1

Figure 2:
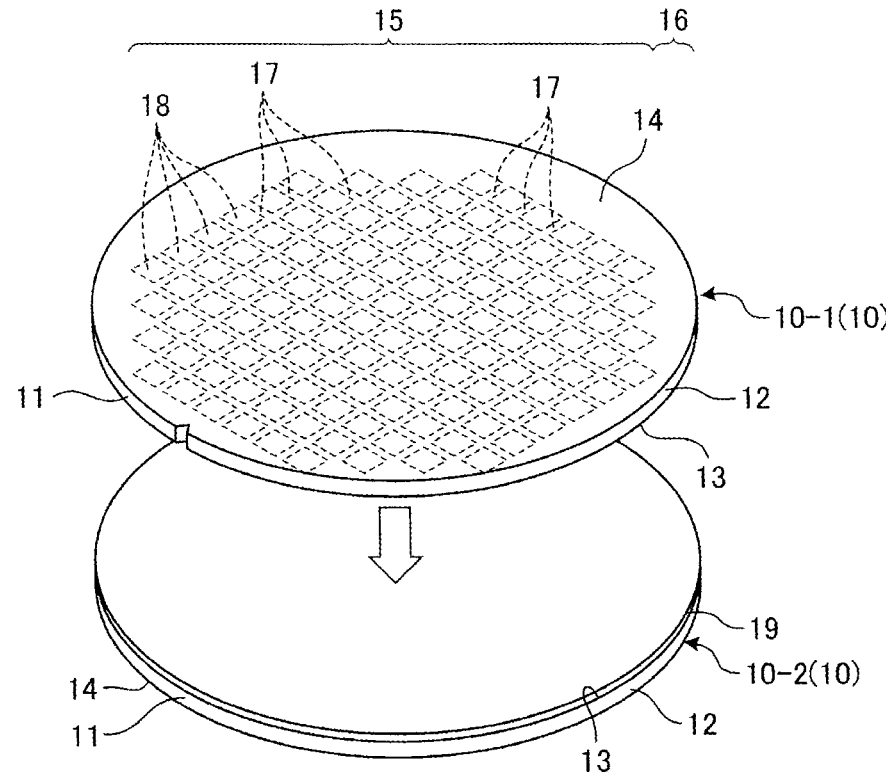
FIG. 2 is a perspective view illustrating the manner in which an bonded wafer assembly forming step of the method illustrated in FIG. 1 is carried out.
Figure 3:
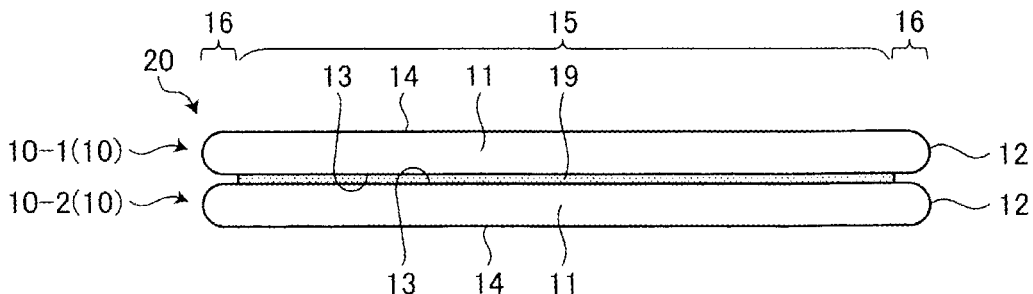
FIG. 3 is a cross-sectional view of an bonded wafer assembly produced by the bonded wafer assembly forming step of the method illustrated in FIG. 1.

FIG. 2 illustrates, in perspective, the manner in which the bonded wafer assembly forming step 1 of the method illustrated in FIG. 1 is carried out. FIG. 3 illustrates, in cross section, a bonded wafer assembly 20 produced by the bonded wafer assembly forming step 1 of the method illustrated in FIG. 1. The bonded wafer assembly forming step 1 represents a step of bonding a surface of the first wafer 10-1 to a surface of the second wafer 10-2, producing the bonded wafer assembly 20.

The configurations of the wafers 10, i.e., the first wafer 10-1 and the second wafer 10-2, to be processed will be described below. Each of the wafers 10 illustrated in FIGS. 2 and 3 is a wafer such as a semiconductor wafer or an optical device wafer shaped as a circular plate made of silicon (Si), sapphire ($Al_2O_3$), gallium arsenide (GaAs), silicon carbide (SiC), or the lie. According to the present embodiment, each of the wafers 10 is a silicon wafer. As illustrated in FIG. 3, each of the wafers 10 includes a substrate 11 having opposite surfaces referred to as a face side 13 and a reverse side 14, respectively, and an outer circumferential edge 12 extending circularly around the wafer 10. The outer circumferential edge 12 is beveled into an arcuate cross-sectional shape extending thicknesswise thereacross from the face side 13 to the reverse side 14, such that a central portion in thicknesswise directions thereof protrudes farthest radially outwardly.

As illustrated in FIG. 2, each of the wafers 10 has a device region 15 and an outer circumferential excessive region 16 surrounding the device region 15. The device region 15 has a grid of projected dicing lines 17 established in the face side 13 of the substrate 11 and a plurality of devices 18 constructed in respective areas demarcated by the projected dicing lines 17. The outer circumferential excessive region 16 surrounds the device region 15 fully therearound and is free of any devices 18.

According to the present embodiment, each of the devices 18 is a 3D NAND flash memory and has an electrode pad and a plurality of through-electrodes electrically connected to the electrode pad. The through-electrodes extend to the reverse side 14 of the substrate 11 when the substrate 11 is thinned down to divide the wafer 10 into the individual devices 18. Consequently, each of the wafers 10 according to the present embodiment is what is called a TSV wafer where the individually divided devices 18 have through-electrodes. According to the present invention, however, each of the wafers 10 is not limited to a TSV wafer with through-electrodes, and may be a device wafer free of through-electrodes.

According to the present embodiment, in the bonded wafer assembly forming step 1, the surfaces of the wafers 10 to be bonded to each other are their face sides 13. In the bonded wafer assembly forming step 1, as illustrated in FIG. 2, a junction layer 19 is laminated on one of the face sides 13 of the first wafer 10-1 and the second wafer 10-2. According to the present embodiment, the junction layer 19 is laminated on the face side 13 of the second wafer 10-2. According to the present embodiment, the junction layer 19 is a double-faced adhesive tape having a base layer and adhesive layers deposited on the respective face and reverse sides of the base layer. According to the present invention, however, the junction layer 19 is not limited to a double-faced adhesive tape, but may be an oxide film coated with an adhesive containing resin or the like. Alternatively, the first wafer 10-1 and the second wafer 10-2 may be joined directly to each other with no junction layer 19 interposed therebetween.

In the bonded wafer assembly forming step 1, as illustrated in FIG. 2, the face side 13 of the first wafer 10-1 and the junction layer 19 deposited on the face side 13 of the second wafer 10-2 are placed in confronting relation to each other with a spacing left therebetween. Then, as illustrated in FIG. 3, the face side 13 of the first wafer 10-1 and the face side 13 of the second wafer 10-2 are bonded to each other by the junction layer 19 interposed therebetween, thereby making up the bonded wafer assembly 20.

Wafer Processing Apparatus 30

Figure 4:
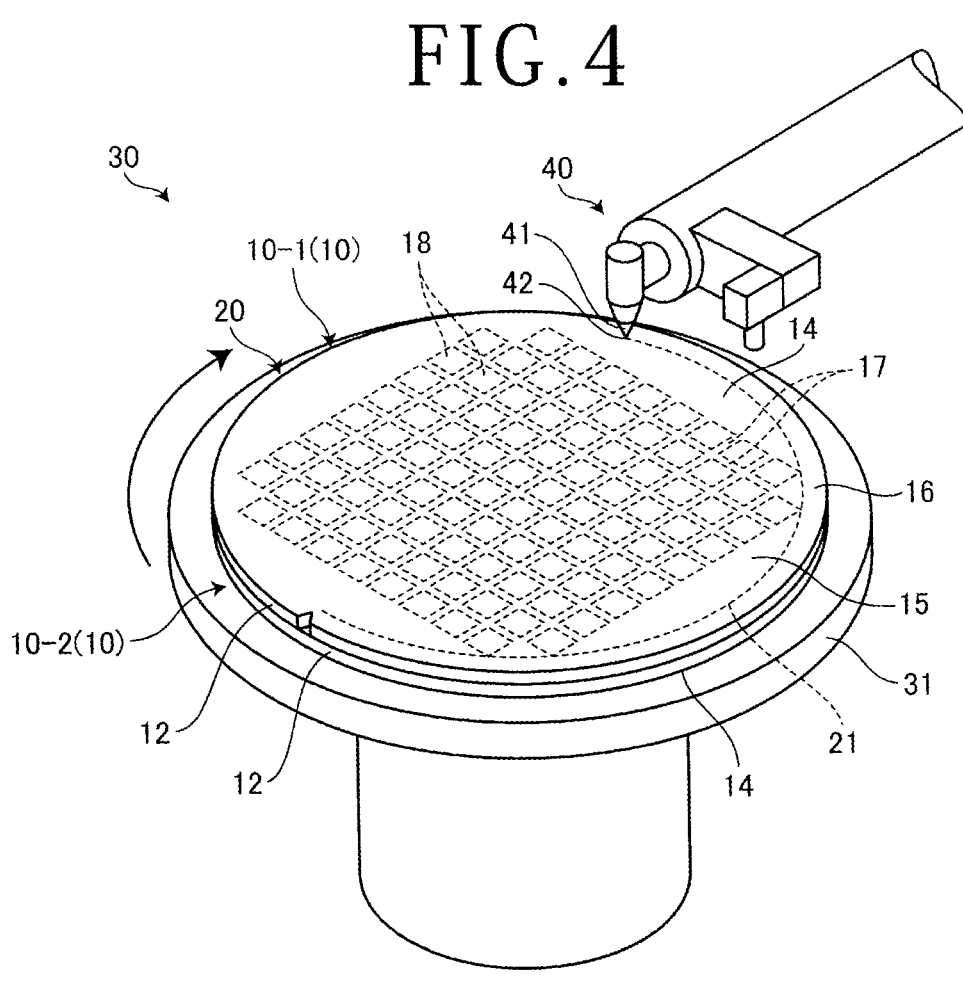
FIG. 4 is a perspective view illustrating the manner in which a separation layer forming step of the method illustrated in FIG. 1 is carried out.

According to the present embodiment, the separation layer forming step 2, the grinding step 3, and the detecting step 4 are carried out by a wafer processing apparatus 30 illustrated in FIG. 4. The wafer processing apparatus 30 includes a holding table 31 (see FIGS. 4, 7, 8, and 9), a laser beam applying unit 40 (see FIG. 4), a grinding unit 50 (see FIGS. 7 and 8), a light source 60 (see FIGS. 9 and 10), a pair of light detecting units or light detectors 62 and 63 (see FIGS. 9 and 10), and a determination section 65 (see FIG. 9). The wafer processing apparatus 30 further includes a moving unit, not illustrated, for moving the laser beam applying unit 40, the grinding unit 50, the light source 60, and the light detecting units 62 and 63 with respect to the holding table 31, and an image capturing unit, not illustrated, for capturing an image of the bonded wafer assembly 20 held on the holding table 31.

As illustrated in FIGS. 4, 7, 8, and 9, the holding table 31 holds the bonded wafer assembly 20 on a holding surface, i.e., an upper surface, thereof. The holding table 31 is rotatable about its central axis that extends vertically. The holding surface is of a circular shape and is made of porous ceramic or the like, for example. According to the present embodiment, the holding surface represents a flat surface lying horizontally. The holding surface is fluidly connected to a vacuum suction source, not illustrated, through a vacuum suction channel, not illustrated. The holding table 31 holds the bonded wafer assembly 20 under suction on the holding surface by vacuum suction forces generated by the vacuum suction source and transmitted via the vacuum suction channel to the holding surface.

As illustrated in FIG. 4, the laser beam applying unit 40 represents a unit for applying a laser beam 41 to the bonded wafer assembly 20 held on the holding surface of the holding table 31. The laser beam applying unit 40 has a laser oscillator, not illustrated, for emitting the laser beam 41 and a beam condenser, not illustrated, for focusing the laser beam 41 emitted from the laser oscillator, for example. The laser beam 41 includes a laser beam having a wavelength transmittable through the wafers 10, for example.

Figure 7:
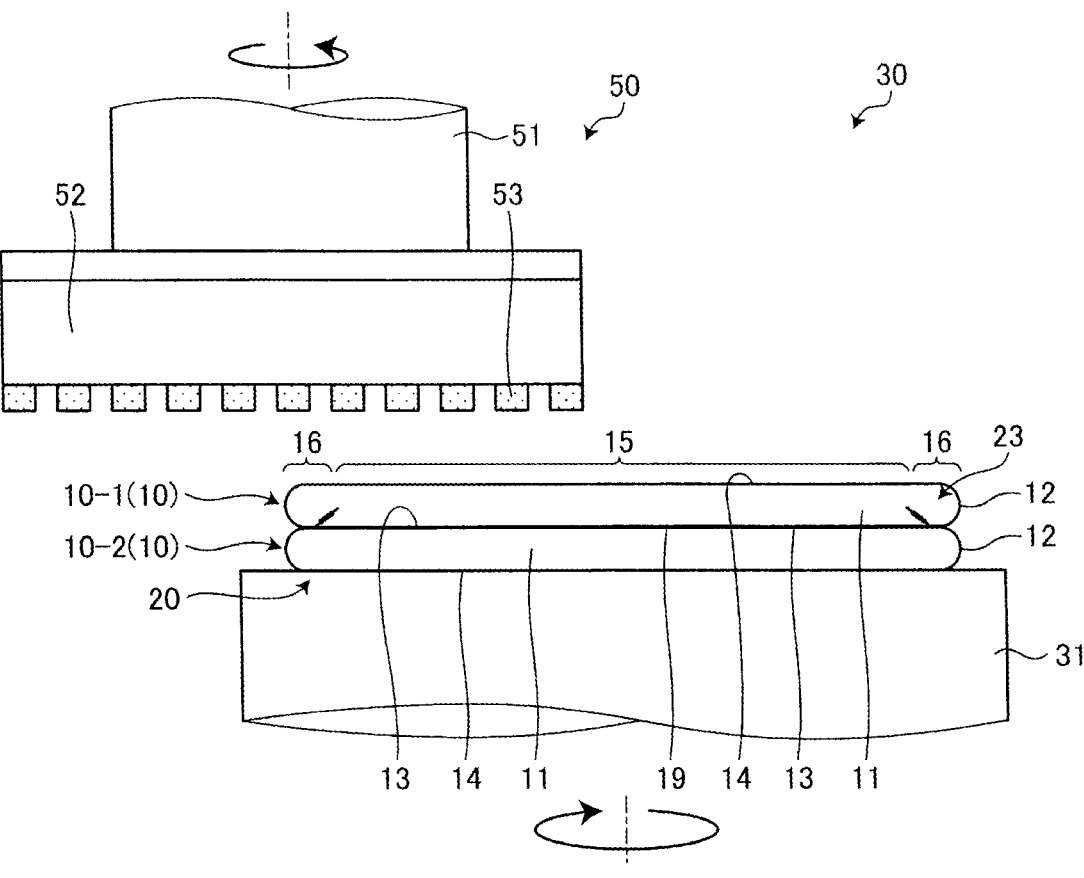
FIG. 7 is a side elevational view, partly in cross section, illustrating the manner in which a grinding step of the method illustrated in FIG. 1 is carried out.
Figure 8:
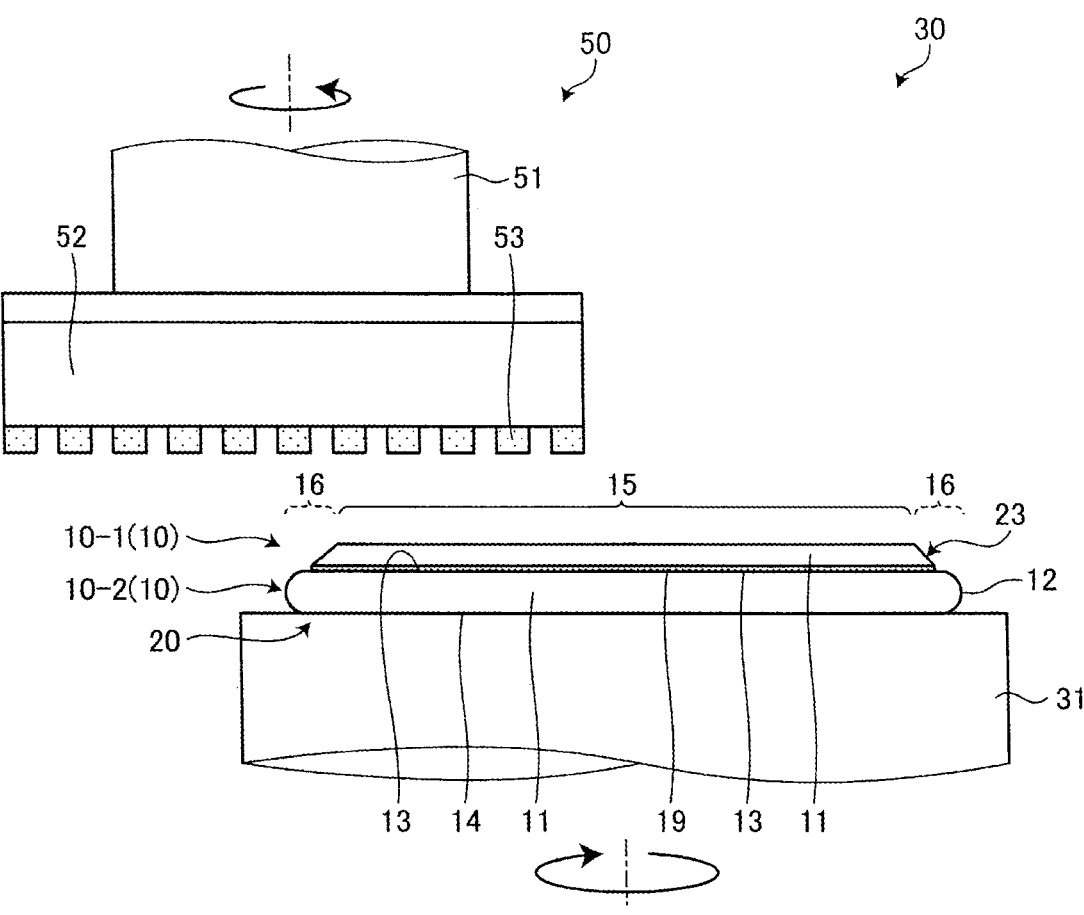
FIG. 8 is a side elevational view, partly in cross section, illustrating the bonded wafer assembly that has undergone the grinding step of the method illustrated in FIG. 1.

As illustrated in FIGS. 7 and 8, the grinding unit 50 represents a unit for grinding the bonded wafer assembly 20 held on the holding surface of the holding table 31, to thin it down to a predetermined thickness. The grinding unit 50 includes a spindle 51 as a rotational shaft, a grinding wheel 52 mounted on a lower end of the spindle 51, and an annular array of grindstones 53 mounted on a lower surface of the grinding wheel 52. The spindle 51 is rotatable about its central axis to rotate the grinding wheel 52 about the central axis of the spindle 51, i.e., an axis parallel to the central axis of the holding table 31. The grindstones 53 are positioned above and face the upper surface of the bonded wafer assembly 20 held on the holding surface of the holding table 31. The grinding unit 50 further includes a grinding liquid supply unit, not illustrated, for supplying a grinding liquid, typically water, to an area where the grindstones 53 are to abrasively contact and hence process, i.e., grind, the upper surface of the bonded wafer assembly 20.

Figure 9:
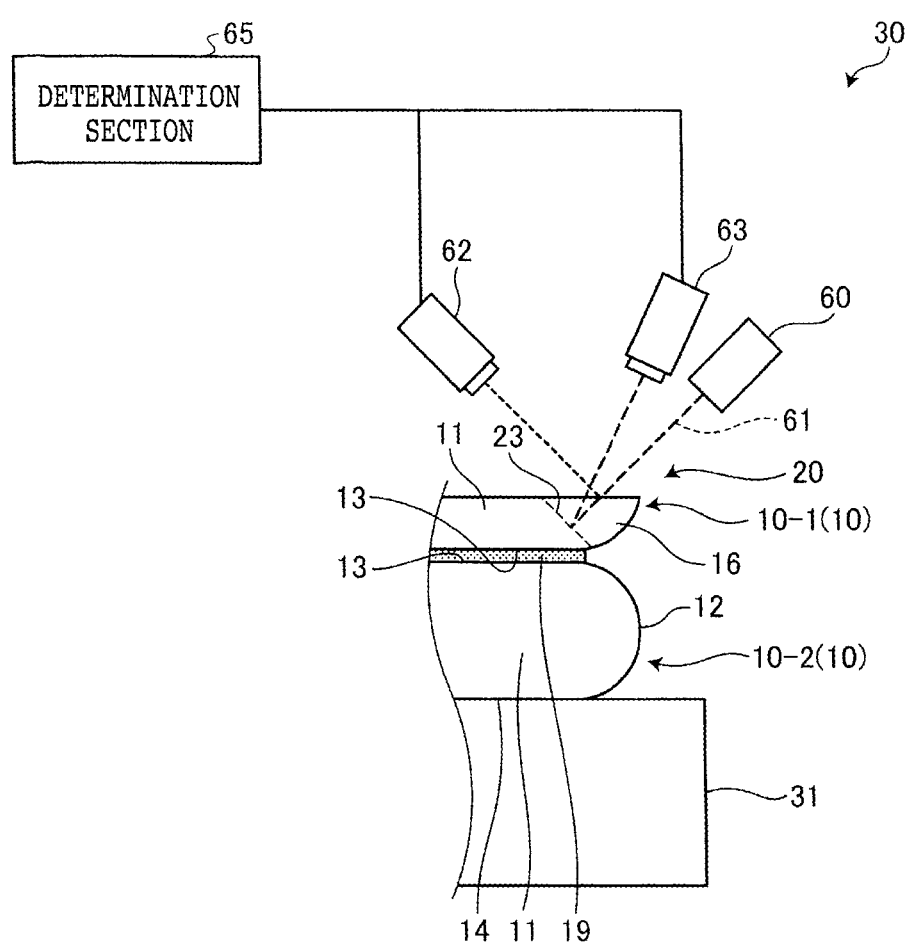
FIG. 9 is a side elevational view, partly in cross section, illustrating the manner in which a detecting step of the method illustrated in FIG. 1 is carried out.
Figure 10:
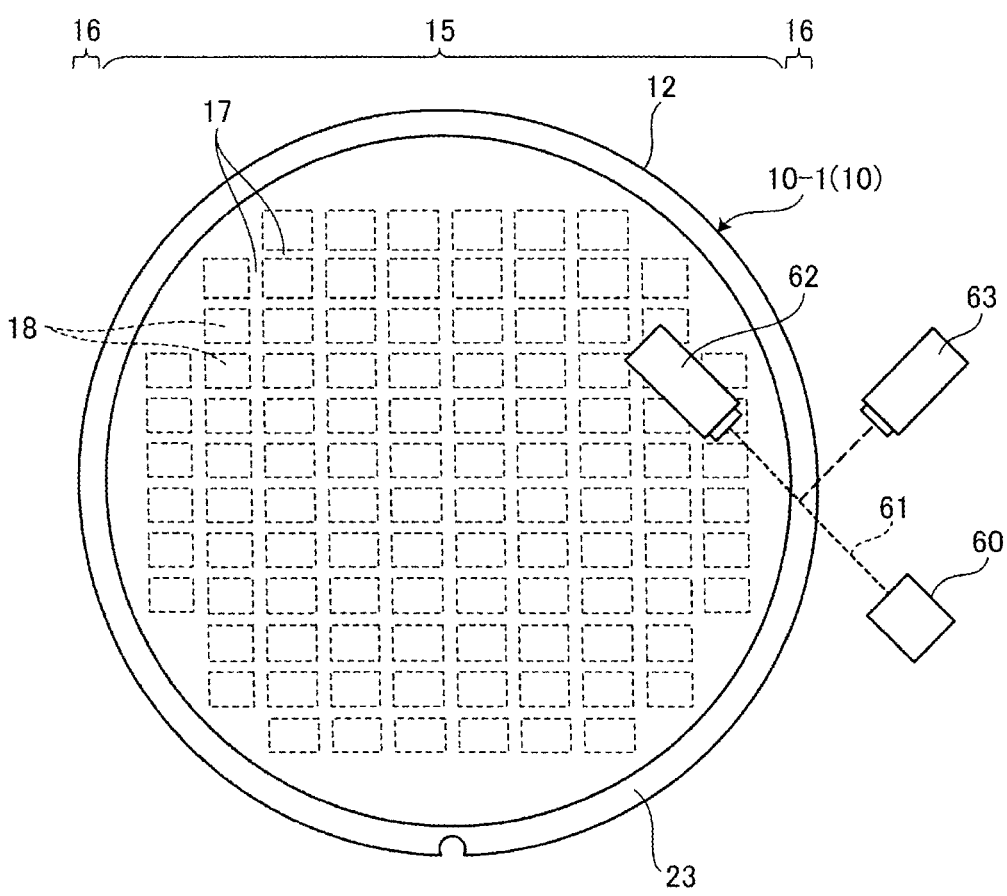
FIG. 10 is a plan view illustrating the manner in which the detecting step of the method illustrated in FIG. 1 is carried out.

As illustrated in FIGS. 9 and 10, the light source 60 emits and applies measurement light 61 to the outer circumferential excessive region 16 of the first wafer 10-1 of the bonded wafer assembly 20 on the holding table 31. If the outer circumferential excessive region 16 that extends from a separation layer 23 to be described later in the first wafer 10-1 to the outer circumferential edge 12 has not been removed, then the measurement light 61 is reflected by a ground upper surface, i.e., the reverse side 14, of the outer circumferential excessive region 16. On the other hand, if the outer circumferential excessive region 16 that extends from the separation layer 23 to the outer circumferential edge 12 has been removed, then the measurement light 61 is reflected by the separation layer 23 that has been exposed.

As illustrated in FIGS. 9 and 10, the light detecting unit 62 detects the measurement light 61 emitted from the light source 60 and reflected by the ground upper surface of the outer circumferential excessive region 16. The light detecting unit 62 includes a light detecting device such as a photodiode, for example. The light detecting unit 62 converts the intensity of the detected reflected light into an electric signal and outputs the electric signal to the determination section 65. The light detecting unit 62 has its sensing directivity adjustable and is movable relatively to the holding table 31. Alternatively, the light detecting unit 62 may be fixed in position to a stationary apparatus body, not illustrated, of the wafer processing apparatus 30.

As illustrated in FIGS. 9 and 10, the light detecting unit 63 detects the measurement light 61 emitted from the light source 60 and reflected by the separation layer 23 that has been exposed after the removal of the outer circumferential excessive region 16. The light detecting unit 63 includes a light detecting device such as a photodiode, for example. The light detecting unit 63 converts the intensity of the detected reflected light into an electric signal and outputs the electric signal to the determination section 65. The light detecting unit 63 has its sensing directivity adjustable and is movable relatively to the holding table 31. Alternatively, the light detecting unit 63 may be fixed in position to a stationary apparatus body, not illustrated, of the wafer processing apparatus 30.

As illustrated in FIG. 9, the determination section 65 is implemented by a controller for controlling the various above-mentioned components of the wafer processing apparatus 30. The controller is in the form of a computer including a processing device as processing means, a storage device as storage means, and an input/output interface device as communication means. The processing device includes a microprocessor such as a central processing unit (CPU). The storage device has a memory such as a hard disk drive (HDD), a read only memory (ROM), or a random access memory (RAM). The processing device performs various processing operations according to predetermined programs stored in the storage device. The processing device outputs various control signals to the components of the wafer processing apparatus 30 via the input/output interface device according to the results of the performed processing operations.

The determination section 65 determines whether or not the outer circumferential excessive region 16 has been removed from the first wafer 10-1 along the separation layer 23 to be described, on the basis of the measurement light 61 detected by the light detecting units 62 and 63. For example, if the measurement light 61 is reflected by the ground upper surface, i.e., the reverse side 14, of the outer circumferential excessive region 16, then the reflected light is applied to and detected by the light detecting unit 62. On the other hand, if the measurement light 61 is reflected by the exposed separation layer 23, then the reflected light is applied to and detected by the light detecting unit 63.

If the light detecting unit 62 detects the reflected light but the light detecting unit 63 does not detect the reflected light, then the determination section 65 determines that the outer circumferential excessive region 16 has not been removed from the first wafer 10-1. On the other hand, if the light detecting unit 63 detects the reflected light but the light detecting unit 62 does not detect the reflected light, then the determination section 65 determines that the outer circumferential excessive region 16 has been removed from the first wafer 10-1.

Separation Layer Forming Step 2

Figure 5:
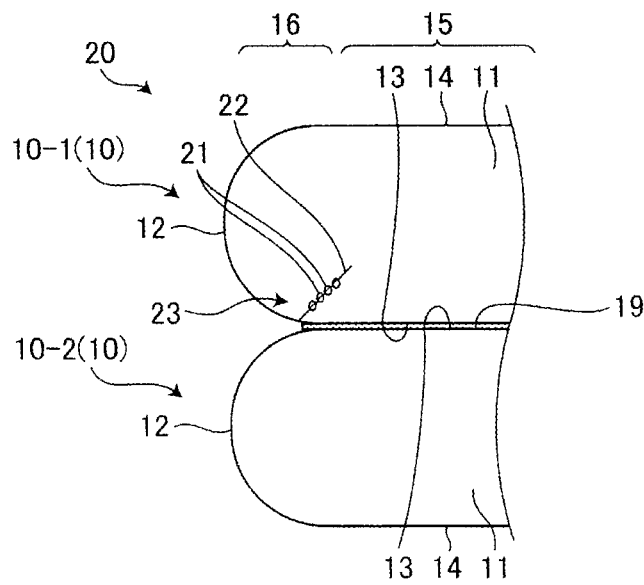
FIG. 5 is a fragmentary cross-sectional view of the bonded wafer assembly that has undergone the separation layer forming step of the method illustrated in FIG. 1.
Figure 6:
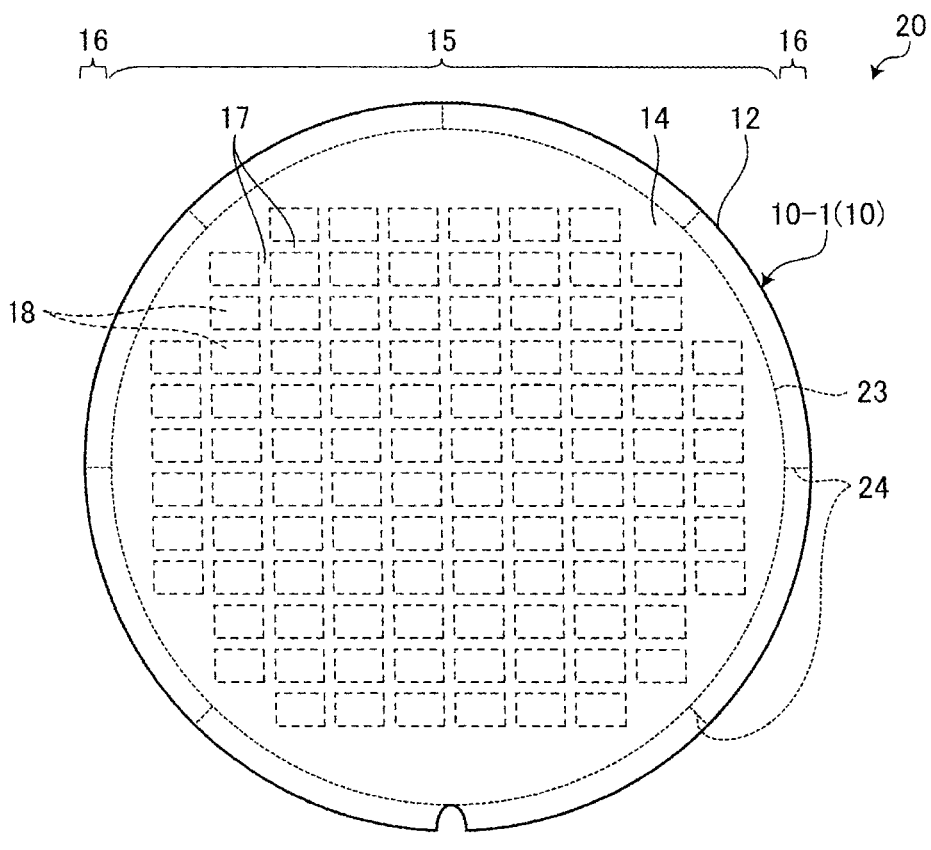
FIG. 6 is a plan view of the bonded wafer assembly that has undergone the separation layer forming step of the method illustrated in FIG. 1.

FIG. 4 illustrates, in perspective, the manner in which the separation layer forming step 2 of the method illustrated in FIG. 1 is carried out. FIG. 5 illustrates, in fragmentary cross section, the bonded wafer assembly 20 that has undergone the separation layer forming step 2 of the method illustrated in FIG. 1. FIG. 6 illustrates, in plan, the bonded wafer assembly 20 that has undergone the separation layer forming step 2 of the method illustrated in FIG. 1. The separation layer forming step 2 is a step of forming a separation layer 23 shaped as a side surface of a truncated cone located in the first wafer 10-1 a predetermined distance radially inwardly from the outer circumferential edge 12 of the first wafer 10-1. In the separation layer forming step 2, the laser beam applying unit 40 of the wafer processing apparatus 30 performs a stealth dicing step to form the separation layer 23 in the first wafer 10-1.

Specifically, in the separation layer forming step 2, the laser beam applying unit 40 applies the laser beam 41 to the outer circumferential excessive region 16 of the first wafer 10-1 while positioning a focused spot 42 of the laser beam 41 in a region spaced radially inwardly from the outer circumferential edge 12 on an inclined plane that is progressively closer to one of opposite surfaces of the first wafer 10-1 toward the outer circumferential edge 12, thereby forming a separation layer 23 shaped as a side surface of a truncated cone that is inclined from the one of the opposite surfaces of the first wafer 10-1 to the other of the opposite surfaces of the first wafer 10-1. The one of the opposite surfaces of the first wafer 10-1 represents the face side 13 thereof that is illustrated as a lower surface of the first wafer 10-1 in FIG. 5, whereas the other of the opposite surfaces of the first wafer 10-1 represents the reverse side 14 thereof that is illustrated as an upper surface of the first wafer 10-1 in FIG. 5.

More specifically, in the separation layer forming step 2, the reverse side 14 of the second wafer 10-2 of the bonded wafer assembly 20 is held under suction on the holding surface of the holding table 31 of the wafer processing apparatus 30. Then, the first wafer 10-1 and the beam condenser of the laser beam applying unit 40 are positioned with respect to each other. Specifically, the moving unit of the wafer processing apparatus 30 moves the holding table 31 to an irradiation zone below the laser beam applying unit 40. Then, the image capturing unit captures an image of the first wafer 10-1, and an alignment step is performed on the basis of the captured image. In the alignment process, the beam condenser of the laser beam applying unit 40 is positioned to vertically face a position within the outer circumferential excessive region 16 that is spaced a predetermined distance radially inwardly from the outer circumferential edge 12 of the first wafer 10-1. Thereafter, the laser beam applying unit 40 sets the focused spot 42 of the laser beam 41 within the outer circumferential excessive region 16.

Then, while the holding table 31 is being rotated about its central axis, the laser beam applying unit 40 applies the laser beam 41 to the reverse side 14 of the first wafer 10-1. The focused spot 42 of the laser beam 41 thus applied forms an annular modified layer 21 along successive positions within the outer circumferential excessive region 16 that are spaced the predetermined distance radially inwardly from the outer circumferential edge 12 of the first wafer 10-1.

The modified layer 21 represents a zone whose density, refractive index, mechanical strength, or other physical properties are made different from those of surrounding zones by the laser beam 41 applied to the first wafer 10-1. For example, the modified layer 21 may be referred to as a molten zone, a cracked zone, a dielectric breakdown zone, a varied refractive-index zone, or a zone where those zones occur together. The modified layer 21 is lower in mechanical strength, etc., than the remainder of the first wafer 10-1.

In the separation layer forming step 2, the focused spot 42 of the laser beam 41 is positionally changed to successive positions in the outer circumferential excessive region 16 that are progressively closer to the one of the opposite surfaces of the first wafer 10-1 toward the outer circumferential edge 12, and the laser beam 41 is applied a plurality of times to the first wafer 10-1 when the focused spot 42 is in the respective successive positions. Alternatively, the laser beam 41 is branched into a plurality laser beams that are simultaneously applied to the first wafer 10-1 with their respective focused spots 42 in the respective successive positions in the outer circumferential excessive region 16. In this manner, a plurality of modified layers 21 are formed in the outer circumferential excessive region 16 along the side surface of the truncated cone that is inclined from the face side 13 toward the reverse side 14 of the first wafer 10-1. When the modified layers 21 are formed, cracks 22 are developed from the modified layers 21, and the modified layers 21 and the cracks 22 are joined together, forming the separation layer 23 shaped along the side surface of the truncated cone that is inclined from the face side 13 toward the reverse side 14 of the first wafer 10-1.

As illustrated in FIG. 6, in the separation layer forming step 2 according to the present embodiment, auxiliary separation layers 24 that divide the outer circumferential excessive region 16 extending from the separation layer 23 to the outer circumferential edge 12 into at least two segments may be formed in the outer circumferential excessive region 16 of the first wafer 10-1. For example, in the separation layer forming step 2, auxiliary separation layers 24 are radially formed in the outer circumferential excessive region 16 between an inner circumferential edge thereof and the outer circumferential edge 12 at predetermined circumferential positions in the outer circumferential excessive region 16.

Specifically, the holding table 31 is moved to cause the focused spot 42 of the laser beam 41 to move radially outwardly in the first wafer 10-1. In other words, the laser beam 41 is applied to the first wafer 10-1 while moving the focused spot 42 radially outwardly across the outer circumferential excessive region 16, thereby forming auxiliary separation layers 24 radially in and across the outer circumferential excessive region 16. Alternatively, the laser beam 41 may be applied to the first wafer 10-1 while the holding table 31 is being moved to cause the focused spot 42 to move radially inwardly across the outer circumferential excessive region 16. According to the alternative, the laser beam 41 stops being applied when the focused spot 42 reaches the separation layer 23.

In FIG. 6, the auxiliary separation layers 24 are illustrated as dividing the outer circumferential excessive region 16 circumferentially into eight segments. According to the present invention, more auxiliary separation layers 24 may be formed in and across the outer circumferential excessive region 16 to divide it circumferentially into sixteen segments. Alternatively, annular auxiliary separation layers 24 may be formed in and along the outer circumferential excessive region 16 to divide it radially into a plurality of annular segments. The number of auxiliary separation layers 24 may be selected depending on the diameter of the first wafer 10-1 or the width of the outer circumferential excessive region 16.

To form auxiliary separation layers 24 in the outer circumferential excessive region 16, the laser beam 41 is applied a plurality of times to the first wafer 10-1 while changing the height or vertical position of the focused spot 42 thereof, as in the case of the separation layer 23. Alternatively, the laser beam 41 is branched into a plurality laser beams that are simultaneously applied to the first wafer 10-1 with their respective focused spots 42 spaced thicknesswise across the first wafer 10-1, forming a plurality of modified layers 21 spaced thicknesswise in the outer circumferential excessive region 16.

Grinding Step 3

FIG. 7 illustrates, in side elevation and partly in cross section, the manner in which the grinding step 3 of the method illustrated in FIG. 1 is carried out. FIG. 8 illustrates, in side elevation and partly in cross section, the bonded wafer assembly 20 that has undergone the grinding step 3 of the method illustrated in FIG. 1. The grinding step 3 is performed after the separation layer forming step 2 has been carried out. The grinding step 3 is a step of grinding the first wafer 10-1 of the bonded wafer assembly 20 from the other of the opposite surfaces of the first wafer 10-1, i.e., the reverse side 14 thereof, to thin down the first wafer 10-1 to a predetermined thickness. According to the present embodiment, in the grinding step 3, the grinding unit 50 of the wafer processing apparatus 30 grinds the first wafer 10-1 on the reverse side 14 to thin down the first wafer 10-1 to the predetermined thickness.

Specifically, in the grinding step 3, the holding table 31 with the bonded wafer assembly 20 held thereon is delivered to a position below the grinding unit 50. Then, while the holding table 31 is rotated about its central axis, the grinding wheel 52 is rotated about its central axis by the spindle 51. The grinding liquid supply unit supplies the grinding water to the area where the grindstones 53 are to abrasively contact and hence grind the reverse side 14 of the first wafer 10-1, and the grinding wheel 52 is moved at a predetermined feed speed toward the holding table 31 to press the grindstones 53 into abrasive contact with the first wafer 10-1, grinding the reverse side 14 thereof and hence thinning down the first wafer 10-1 to the predetermined thickness illustrated in FIG. 8.

When the reverse side 14 of the first wafer 10-1 is thus ground, the outer circumferential excessive region 16 that extends from the separation layer 23 to the outer circumferential edge 12 of the first wafer 10-1 is removed under the load imposed on the outer circumferential excessive region 16 by the grindstones 53. The separation layer 23 is now exposed on a newly created outer circumferential edge of the first wafer 10-1, so that the first wafer 10-1 takes on an appearance as a truncated cone where the separation layer 23 is located on its side surface. At this time, an end part of the outer circumferential excessive region 16 may possibly remain unpeeled. The detecting step 4 to be described below detects whether or not the outer circumferential excessive region 16 has been removed in the grinding step 3.

Detecting Step 4

FIG. 9 illustrates, in side elevation and partly in cross section, the manner in which the detecting step 4 of the method illustrated in FIG. 1 is carried out. FIG. 10 illustrates, in plan, the manner in which the detecting step 4 of the method illustrated in FIG. 1 is carried out. The detecting step 4 is carried out while the grinding step 3 is being carried out or after the grinding step 3 has been carried. According to the present embodiment, the detecting step 4 is carried out after the grinding step 3 has been carried. The detecting step 4 is a step of detecting whether or not the outer circumferential excessive region 16 that extends from the separation layer 23 to the outer circumferential edge 12 has been removed. According to the present embodiment, the detecting step 4 is performed by the light source 60, the light detecting units 62 and 63, and the determination section 65 of the wafer processing apparatus 30.

In the detecting step 4, the holding table 31 with the bonded wafer assembly 20 held thereon is delivered to a position below the light source 60 and the light detecting units 62 and 63. Then, the light source 60 is positioned with respect to the bonded wafer assembly 20 on the holding table 31 such that the measurement light 61 emitted from the light source 60 will be applied to the ground surface of the outer circumferential excessive region 16 of the first wafer 10-1 of the bonded wafer assembly 20 or the separation layer 23 exposed after the outer circumferential excessive region 16 has been removed.

The light detecting unit 62 is adjusted in position and angle such that, if the measurement light 61 emitted from the light source 60 is reflected by the outer circumferential excessive region 16, then the reflected light from the outer circumferential excessive region 16 will be applied to the light detecting unit 62. The light detecting unit 63 is adjusted in position and angle such that, if the measurement light 61 emitted from the light source 60 is reflected by the exposed separation layer 23, then the reflected light from the exposed separation layer 23 will be applied to the light detecting unit 63. In a case where the light detecting units 62 and 63 are fixed in position to the stationary apparatus body, not illustrated, of the wafer processing apparatus 30, the light detecting units 62 and 63 are adjusted in position and angle by moving the holding table 31 with respect to the light detecting units 62 and 63.

After the light detecting units 62 and 63 have been adjusted in position and angle, the light source 60 emits and applies the measurement light 61 to the outer circumferential excessive region 16 that extends from the separation layer 23 to the outer circumferential edge 12, or the area where the outer circumferential excessive region 16 was present. The measurement light 61 is reflected by the first wafer 10-1, and the reflected light is applied to the light detecting unit 62 or the light detecting unit 63, as described below.

If the outer circumferential excessive region 16 that extends from the separation layer 23 to the outer circumferential edge 12 has not been removed, then the measurement light 61 is reflected by the ground surface of the outer circumferential excessive region 16 of the first wafer 10-1, and the reflected light is applied to the light detecting unit 62. The light detecting unit 62 converts the intensity of the detected reflected light into an electric signal and outputs the electric signal to the determination section 65.

If the outer circumferential excessive region 16 that extends from the separation layer 23 to the outer circumferential edge 12 has been removed, then the measurement light 61 is reflected by the exposed separation layer 23 of the first wafer 10-1, and the reflected light is applied to the light detecting unit 63. The light detecting unit 63 converts the intensity of the detected reflected light into an electric signal and outputs the electric signal to the determination section 65.

The determination section 65 determines whether or not the outer circumferential excessive region 16 that extends from the separation layer 23 to the outer circumferential edge 12 has been removed, on the basis of the detection of the reflected light by the light detecting units 62 and 63. Specifically, if the light detecting unit 62 detects the reflected light but the light detecting unit 63 does not detect the reflected light, then the determination section 65 determines that the outer circumferential excessive region 16 has not been removed from the first wafer 10-1. On the other hand, if the light detecting unit 63 detects the reflected light but the light detecting unit 62 does not detect the reflected light, then the determination section 65 determines that the outer circumferential excessive region 16 has been removed from the first wafer 10-1.

External Force Applying Step 5

Figure 11:
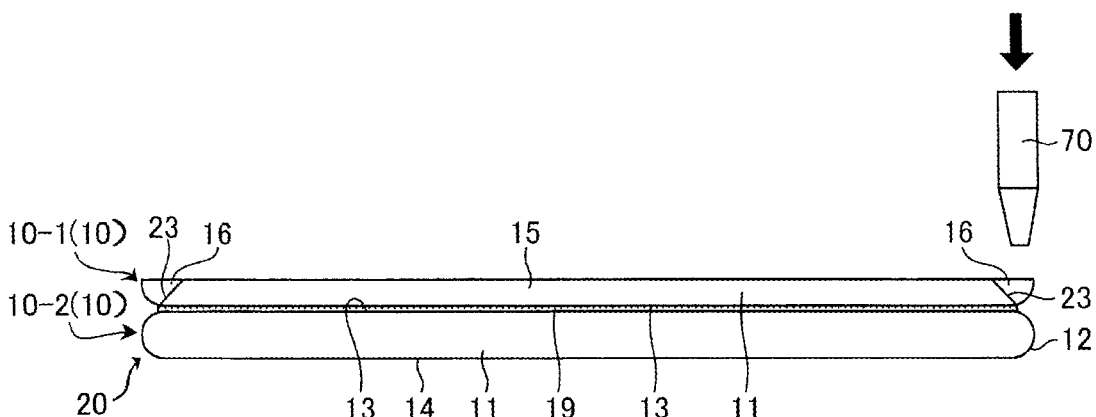
FIG. 11 is a side elevational view, partly in cross section, illustrating the manner in which an example of an external force applying step of the method illustrated in FIG. 1 is carried out.

FIG. 11 illustrates, in side elevation and partly in cross section, the manner in which an example of the external force applying step 5 of the method illustrated in FIG. 1 is carried out. The external force applying step 5 is a step of applying an external force to the outer circumferential excessive region 16 to remove the outer circumferential excessive region 16 from the first wafer 10-1, providing the determination section 65 determines that the outer circumferential excessive region 16 has been removed from the first wafer 10-1 in the detecting step 4. In the example illustrated in FIG. 11, the external force applying step 5 removes the outer circumferential excessive region 16 from the first wafer 10-1 by applying a shearing force in a thicknesswise direction of the first wafer 10-1 with a presser 70.

Specifically, the presser 70 is vertically movable and is normally positioned above a position corresponding to the outer circumferential excessive region 16 of the first wafer 10-1. When actuated, the presser 70 presses the first wafer 10-1 from above, imposing an external force thereon. In the external force applying step 5 illustrated in FIG. 11, the presser 70 vertically faces the outer circumferential excessive region 16 of the first wafer 10-1, and is lowered and pressed against the outer circumferential excessive region 16 from above.

The presser 70 imposes an external force downwardly to the outer circumferential excessive region 16. Under the applied external force, the outer circumferential excessive region 16 is separated from the device region 15 along the separation layer 23 and the auxiliary separation layers 24 (see FIG. 6) that function as separation initiating points. In this manner, the outer circumferential excessive region 16 is removed from the first wafer 10-1.

Figure 12:
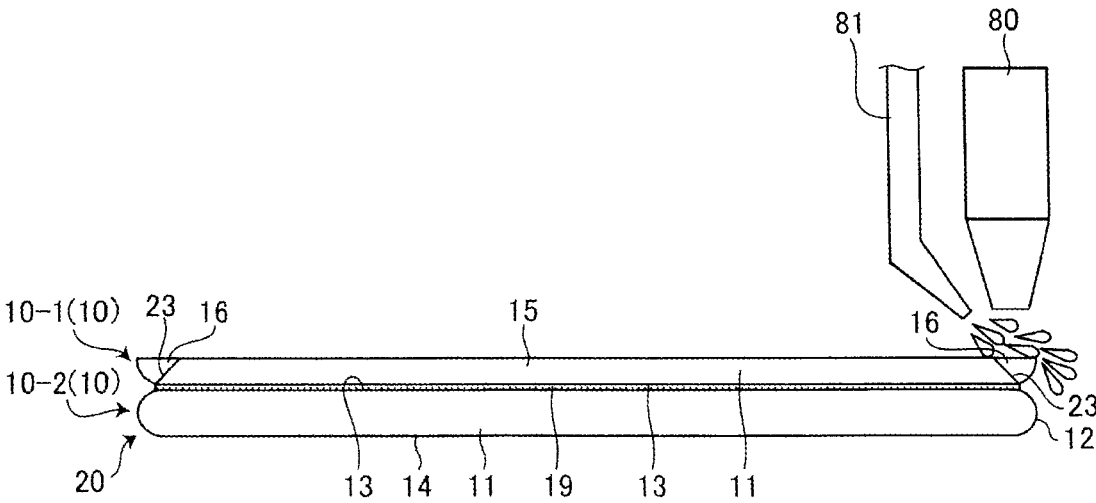
FIG. 12 is a side elevational view, partly in cross section, illustrating the manner in which another example of the external force applying step of the method illustrated in FIG. 1 is carried out.

FIG. 12 illustrates, in side elevation and partly in cross section, the manner in which another example of the external force applying step 5 of the method illustrated in FIG. 1 is carried out. In the example illustrated in FIG. 12, the external force applying step 5 applies ultrasonic waves to the outer circumferential excessive region 16 of the first wafer 10-1 with an ultrasonic wave applying unit 80, removing the outer circumferential excessive region 16 from the first wafer 10-1 with an external force developed by vibrations caused by the applied ultrasonic waves.

The ultrasonic wave applying unit 80 includes, for example, an ultrasonic vibrator that expands and contracts by alternating current (AC) electric power applied thereto, to cause the ground surface of the first wafer 10-1 to generate ultrasonic vibrations, an electric power supply for applying the AC electric power to the ultrasonic vibrator, and a liquid supply unit 81. In the example of the external force applying step 5 illustrated in FIG. 12, the ultrasonic vibrator is positioned to vertically face the outer circumferential excessive region 16, and the liquid supply unit 81 supplies a liquid to an area between the ultrasonic vibrator and the ground surface of the outer circumferential excessive region 16. The liquid may be pure water, for example.

Then, while the end face of the ultrasonic vibrator that faces the outer circumferential excessive region 16 is being immersed in the liquid, the electric power supply applies the AC electric power to the ultrasonic vibrator of the ultrasonic wave applying unit 80 for a predetermined period of time, ultrasonically vibrating the end face of the ultrasonic vibrator that faces the outer circumferential excessive region 16. The ultrasonic vibrations of the ultrasonic vibrator are transmitted through the liquid to the outer circumferential excessive region 16, further developing the cracks 22 of the separation layer 23 in the first wafer 10-1. The outer circumferential excessive region 16 is now separated from the device region 15 along the separation layer 23 that functions as a separation initiating point. In this manner, the outer circumferential excessive region 16 is removed from the first wafer 10-1.

In regard to the application of an external force in the external force applying step 5, the present invention is not limited to the processing of pressing the outer circumferential excessive region 16 from above to apply a shearing force as an external force thereto as illustrated in FIG. 11 or the processing of transmitting ultrasonic vibrations to the outer circumferential excessive region 16 to apply an external force thereto as illustrated in FIG. 12. For example, a roller may be rolled on the outer circumferential excessive region 16 to fracture it, or a claw may be inserted beneath the outer circumferential excessive region 16 and lifted to apply a shearing force as an external force thereto. Alternatively, the grinding step 3 described above may be carried out over and again to keep imposing a grinding load on the first wafer 10-1 until the outer circumferential excessive region 16 is removed from the first wafer 10-1.

As described above, the method of processing the wafer 10 according to the present embodiment is carried out by applying the laser beam 41 to the bonded wafer assembly 20 to form the inclined annular separation layer 23 in the first wafer 10-1 that is spaced a predetermined distance radially inwardly from the outer circumferential edge 12 of the first wafer 10-1. Since the cracks 22 are developed toward the outer circumferential edge 12, rather than the junction layer 19, i.e., the face side 13, in a region of the first wafer 10-1 near the junction layer 19 that joins the wafers 10 to each other, an end part of the outer circumferential excessive region 16 is prevented from remaining joined to the second wafer 10-2 by the junction layer 19.

While the first wafer 10-1 is being ground or after the first wafer 10-1 has been ground, the measurement light 61 is applied to the outer circumferential excessive region 16, and the direction in which the reflected light travels is detected to determine whether or not the outer circumferential excessive region 16 has been removed from the first wafer 10-1. By thus confirming the removal of the outer circumferential excessive region 16, it is possible to deliver only those bonded wafer assemblies 20 where the outer circumferential excessive region 16 has been removed, to a subsequent polishing step. Accordingly, the polishing pad used in the polishing step is prevented from being damaged by end parts of the outer circumferential excessive region 16 that would otherwise tend to remain in the bonded wafer assemblies 20 to be polished.

The present invention is not limited to the embodiment described above. Various changes and modifications may be made therein without departing from the scope of the invention.

For example, the wafer processing apparatus 30 may not necessarily include the laser beam applying unit 40. Specifically, after the separation layer forming step 2 has been performed by another laser processing apparatus, the bonded wafer assembly 20 with the first wafer 10-1 including the modified layers 21 therein may be delivered to the wafer processing apparatus 30, and the grinding step 3 and the detecting step 4 may be performed by the wafer processing apparatus 30. Further, the wafer processing apparatus 30 may not necessarily include the grinding unit 50. Specifically, after the grinding step 3 has been performed by another grinding apparatus, the bonded wafer assembly 20 with the first wafer 10-1 ground to a predetermined thickness may be delivered to the wafer processing apparatus 30, and the detecting step 4 may be performed by the wafer processing apparatus 30. It is sufficient if the wafer processing apparatus 30 includes at least either the light detecting unit 62 or 63 that performs the detecting step 4.

The separation layer forming step 2 may be carried out prior to the bonded wafer assembly forming step 1, and it is sufficient if the bonded wafer assembly 20 and the separation layer 23 are formed at least before the grinding step 3 is carried out.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer comprising:
    a bonded wafer assembly forming step of forming a bonded wafer assembly by bonding one of opposite surfaces of a first wafer to one of opposite surfaces of a second wafer, the first wafer having a device region where a plurality of devices are formed in the one of the opposite surfaces, an outer circumferential excessive region surrounding the device region, and a beveled outer circumferential edge;
    a separation layer forming step of applying a laser beam to the outer circumferential excessive region of the first wafer while positioning a focused spot of the laser beam in a region spaced a predetermined distance radially inwardly from the outer circumferential edge, on an inclined plane that is progressively closer to the one of the opposite surfaces of the first wafer toward the outer circumferential edge, thereby forming a separation layer shaped as a side surface of a truncated cone that is inclined from the one of the opposite surfaces of the first wafer to an other one of the opposite surfaces of the first wafer;
    a grinding step of, after the separation layer forming step has been carried out, grinding the first wafer of the bonded wafer assembly from the other one of the opposite surfaces of the first wafer to thin down the first wafer to a predetermined thickness; and
    a detecting step, performed by a controller including a processor, of, while the grinding step is being carried out or after the grinding step has been carried out, applying measurement light with a light source to the outer circumferential excess region, measuring the intensity of reflected measurement light with a light detecting unit, and using an electrical signal converted, by the light detecting unit, from the measured intensity of the reflected measurement light to determine whether the outer circumferential excessive region that extends from the separation layer to the outer circumferential edge has been removed from the first wafer.

2. The method of processing a wafer according to claim 1, wherein
    the detecting step includes determining whether or not the outer circumferential excessive region has been removed from the first wafer, by detecting at least either light reflected by the outer circumferential excessive region or light reflected by the separation layer.

3. The method of processing a wafer according to claim 1, further comprising:
    in a case where it is determined in the detecting step that the outer circumferential excessive region has not been removed from the first wafer,
    an external force applying step of applying an external force to the outer circumferential excessive region to remove the outer circumferential excessive region from the first wafer.

* * * * *